US007057264B2

(12) United States Patent
Wang et al.

(10) Patent No.: US 7,057,264 B2
(45) Date of Patent: Jun. 6, 2006

(54) CURABLE COMPOUNDS CONTAINING REACTIVE GROUPS: TRIAZINE/ISOCYANURATES, CYANATE ESTERS AND BLOCKED ISOCYANATES

(75) Inventors: Renyi Wang, Los Angeles, CA (US); Bing Wu, Shanghai (CN); Harry Richard Kuder, Fullerton, CA (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 304 days.

(21) Appl. No.: 10/274,664

(22) Filed: Oct. 18, 2002

(65) Prior Publication Data

US 2004/0075161 A1 Apr. 22, 2004

(51) Int. Cl.
*H01L 23/62* (2006.01)

(52) U.S. Cl. .................. 257/666; 524/236; 525/43
(58) Field of Classification Search ............. 257/632, 257/666, 791, E51.051; 428/423.1, 500, 428/502, 522, 523; 523/135; 524/236; 525/87, 525/97, 180, 443

See application file for complete search history.

(56) References Cited

U.S. PATENT DOCUMENTS

| 3,004,896 | A | | 10/1961 | Heller |
| 3,493,539 | A | | 2/1970 | Skouitchi et al. .............. 260/47 |
| 4,428,987 | A | | 1/1984 | Bell et al. .................... 427/327 |
| 4,448,847 | A | | 5/1984 | Bell et al. .................... 428/413 |
| 4,842,946 | A | * | 6/1989 | Foust et al. .................. 428/458 |
| 4,981,994 | A | * | 1/1991 | Jackson ....................... 560/301 |
| 5,122,858 | A | | 6/1992 | Mahulikar et al. ............. 357/70 |
| 5,130,402 | A | * | 7/1992 | Akiyama et al. .............. 528/45 |
| 5,143,785 | A | * | 9/1992 | Pujol et al. .................. 428/352 |
| 5,449,951 | A | | 9/1995 | Parthasarathi et al. ...... 257/677 |
| 5,723,523 | A | | 3/1998 | Engelhardt et al. |
| 5,741,544 | A | * | 4/1998 | Mahulikar .................. 427/236 |
| 6,057,402 | A | * | 5/2000 | Zhou et al. .................. 525/122 |
| 6,225,378 | B1 | | 5/2001 | Wang et al. ................. 523/454 |
| 6,391,948 | B1 | * | 5/2002 | Clark et al. .................. 524/101 |
| 6,482,523 | B1 | * | 11/2002 | Morikawa et al. ........ 428/423.1 |
| 6,716,891 | B1 | * | 4/2004 | Meisenburg et al. .......... 522/90 |
| 6,794,442 | B1 | * | 9/2004 | Colyer et al. ................ 524/548 |
| 2001/0036985 | A1 | | 11/2001 | Lee et al. |

FOREIGN PATENT DOCUMENTS

| DE | VV M 814/6.76 | 11/1985 |
| DE | 44 36 355 A 1 | 6/1995 |
| DE | 197 48 658 A1 | 5/1998 |
| EP | 0 251 490 | 5/1987 |
| EP | 0 251 490 A2 | 5/1987 |
| EP | 0 285 266 A2 | 3/1988 |
| EP | 0 285 266 A3 | 3/1988 |
| EP | 0 285 266 | 4/1988 |
| EP | 0 176 555 | 12/1988 |
| EP | 0 431 868 | 3/1990 |
| EP | 0 659 860 | 6/1995 |
| EP | 0 736 577 | 3/1996 |
| EP | 0 970 946 | 1/1999 |
| EP | 1 033 590 | 2/2000 |
| EP | 1 033 590 A2 | 2/2000 |
| FR | 1325404 | 6/1962 |
| FR | 1330378 | 6/1962 |
| FR | 1330379 | 6/1962 |
| FR | 2122465 | 1/1972 |
| JP | 1995 007 1986 | 3/1995 |
| JP | 1996 017 0111 | 7/1996 |
| JP | 1996 020 5143 | 8/1996 |
| JP | HEI 11-1999-195358 | 7/1999 |
| JP | HEI 11-1999-196722 | 7/1999 |
| JP | HEI 11-1999-285892 | 10/1999 |
| JP | 2000096032 | 4/2000 |
| JP | 2001 244 383 | 7/2001 |
| WO | WO 01/58227 | 8/2001 |

OTHER PUBLICATIONS

Parthasarathi, Arvind et al.: "Leadframe Treatment To Prevent Delamination in Plastic Packages"; Pub. # 14-115; 1994, 1998 Rogers Corporation.

Dai, Qinpin et al.: "SERS and IR Studies of Polymerization of an Epoxy Compound on Top of Benzotriazole Absorbed on Copper"; Spectroscopy Letter, (28)1, 43-54 (1995); Marcel Dekker, Inc. 1995.

Fournier, T. et al.: "Femtosecond laser studies of excited state intramolecular proton transfer in an ultraviolet—filter molecule"; Chem. Phys. Lett. 2000, 325 (1,2,3), 171-175 (Eng), Elsevier Science B.V.; CA Selects: Siloxanes & Silicones, Issue 23, 2000.

Huneke, James T. et al.: "Die Attach Adhesion on Leadframes Treated with Antioxidants"; Oct. 1997 IEEE/CPMT Electronic Packaging Technology Conf.-Singapore.

Ostrauskaite, Jolita et al.: "Synthesis and cationic polymerization of 5-(2,3-expoxypropyl)amino-2-phenyl-1,2,3-benzotriazole"; European Polymer Journal 36 (2000) 2499-2504; Kaunas Univ. of Tech., Kaunas, Lithuania.

Kim, Taek Hyeon et al.: "Melt Free-Radical Grafting of Hindered Phenol Antioxidant onto Polyethylene"; Journal of Applied Polymer Science, vol. 77, 2968-2973 (2000); Kwangju, Korea; John Wiley & Sons, Inc. Pub.

Kim, Taek Hyeon et al.: "Free Radicals Grafting of Hindered Phenol Antioxidants Onto Low Molecular Weight PE"; Polymer Preprints 2000, 41(2), 1237; Kwangju, Korea.

(Continued)

*Primary Examiner*—Asok Kumar Sarkar
(74) *Attorney, Agent, or Firm*—Jane E. Gennaro

(57) ABSTRACT

This invention is directed to compounds that can be used as antioxidants for exposed metal surfaces, and also as adhesion promoters for adhesive, coating or encapsulant resins that are applied to the metal substrates. These compounds include triazine or isocyanurate compounds bearing reactive or polymerizable functional groups, polyfunctional cyanate esters, and polyfunctional blocked-isocyanates.

8 Claims, No Drawings

OTHER PUBLICATIONS

Bartus, Jan et al.: "Functional Polymers. 63.* Emulsion Copolymerization of Maleimide Type Monomers With Acrylonitrile And Styrene In ABS Latexes"; J.M.S.-Pure Appl. Chem., A36(3), pp. 355-371 (1999); 1999 by Marcel Dekker, Inc.

Stoeber, Lutz et al.: "Functional Polymers. 64. Potasium Ionization Of Desorbed Species (K*IDS) Of 2(2-Hydroxyphenyl)2H-Benzotriazoles"; J.M.S.-Pure Appl. Chem., A37(11), pp. 1269-1300 (2000); 2000 by Marcel Dekker, Inc.

Stoeber, Lutz et al.: "Functional Polymers 65. Synthesis And Brief Characterization of Surface Active 2(2-Hydroxphenyl)2H-Benzotriazole Ultraviolet Stabilizers"; J.M.S.-Pure Appl. Chem., A37(9), pp. 943-970 (2000); 2000 by Marcel Dekker, Inc.

No Author: Graphs: "A Benzotriazole Family"; "p-Polyhydroxystyrene Family"; TriQuest, LP.

ACS Registry Database Structure Search, 54 Entries, 66 Pages.

Kim, H. et al.: "Corrosion protection and adhesion promotion for polyimide/copper system using silane-modified polymeric materials"; Polymer 41 (2000) 6553-6561, Seoul South Korea.

Yu, J. et al.: "Miscibility of Polyimide with Polymeric Primer and Its Influence on Adhesion of Polyimide to the Primed Copper Metal: Effect of Precursor Origin"; Journal of Polymer Science: Part B: Polymer Pysics, vol. 37, 2806-2814 (1999); Pub. John Wiley & Sons, Inc.

Ishida, H. et al.: "Modified Imidazoles: Degradation Inhibitors and Adhesion Promoters for Polyimide Films on Copper Substrates"; J. Adhesion, 1991, vol. 36, pp. 177-191; 1991 Gordon and Breach Science Publishers S.A., U.K.

Parthasarathi, Arvind et al.: "Leadframe Treatment To Prevent Delamination In Plastic Packages"; Pub. # 14-115; 1994, 1998 Rogers Corporation.

Dai, Qinpin et al.: "SERS and IR Studies of Polymerization of an Epoxy Compound on Top of Benzotriazole Adsorbed on Copper"; Spectroscopy Letter, 28(1), 43-54 (1995); Marcel Dekker, Inc. 1995.

Xue, Gi et al.: "Stable SERS Substrates Used for In Situ Studies of the Polymer-Metal Interface at Elevated Temperature"; Macromolecules 1994, 27, 809-813; 1994 American Chemical Society.

Poling, G.W.: "Reflection Infra-Red Studies Of Films Formed By Benzotriazole On Cu*"; Corrosion Science, 1970, vol. 10, pp. 359 to 370, Pergamon Press, Printed in Great Britain.

Xue, Gi et al.: "SERS, XPS, and Electroanalytical Studies of the Chemisorption of Benzotriazole on a Freshly Etched Surface and and an Oxidized Surface of Copper"; J. Phys. Chem. 1991, 95, 7380-7384.

Yoshida, Shuji et al.: "A FT-IR Reflection-Absorption Spectroscopic Study of an Epoxy Coating on Imidazole-Treated Copper"; J. Adhesion, 1984, vol. 16, pp. 217-232; 1984 Gordon & Breach Science Publishers, Inc., U.K.

Mansfield, Florian et al.: Technical Note "Benzotriazole as Corrosion Inhibitor for Copper II. Acid NaC1 Solutions"; Corrosion-Nace, North American Rockwell Science Center, Thousand Oaks, CA; Submitted for publication Aug., 1972.

Vogt, Jurgen: "Thermoset Matrices for Structural Adhesives: Imidazole-Catalysed Curing of Epoxy Resins"; J. Adhesion, 1987. vol. 22, pp. 139-151, 1987 Gordon & Breach Science Publishers, Inc., U.K.

Cho, Kilwon et al.: "Effect of the microstructure of copper oxide on the adhesion behavior of epoxy/copper leadframe joints"; J. Adhesion Sci. Technol, vol. 14, No. 11, pp. 1333-1353 (2000).

Lee, H. Y.: "Failure paths of the Cu-based leadframe/EMC joints"; Materials Science and Engineering A311 (2001) 217-225; 2001 Elsevier Science B.V.

Chong, Chai Tai et al.: "Investigation on the Effect of Copper Leadframe Oxidation on Package Delamination"; 1995 IEEE.

Huang, Yizhe Elisa et al.: "Effect Of Solder Reflow Temperature Profile On Plastic Package Delamination"; 1998 IEEE/CPMT Int'l Electronics Manufacturing Technology Symposium.

Kang, Teck-Gyu et al.: "Characterization of Oxidized Copper Leadframes and Copper/Epoxy Molding Compound Interface Adhesion in Plastic Package"; 1998 IEEE.

Schmidt, R. et al.: "Investigation of the Adhesion Strength between Molding Compound and Leadframe at Higher Temperatures"; 1998 IEEE/CPMT Electronics Packaging Technology Conference.

Gaillard, F. et al.: "Grazing-angle Micro-FTIR Spectroscopy (GAM-FTIR): Applications to Adhesion Studies"; Surf. Interface Anal. 27, 865-870 (1999); John Wiley & Sons, Ltd.

Alpern, P. et al.: "A simple model for the mode I popcorn effect for IC packages"; Microelectronics Reliability 40 (2000) 1503-1508; 2000 Elsevier Science Ltd. All rights reserved.

Yu, Shan-Pu et al.: "The Adhesion Strength of A Lead-Free Solder Hot-Dipped on Copper Substrate"; Journal of Electronic Materials, vol. 29, No. 2, 2000.

H. DeBontride et al.: "Study of chromating layers on zinc coated steel using FTIR and Raman spectroscopies: application to adhesion properties"; La Revue de Metallurgie-CIT Science et Genie des Materiaux, Mar. 1995.

Yoshida, S. et al.: "Functional Polymers. XII[a,b]: Synthesis and Polymerization of 2-Vinyl-4-hydroxyphenyl)2 H benzotriazole and 2(3-Vinyl-4-hyroxyphenyl)2 H-benzotriazole"; Monatshefte fur Chemie 113, 603-622 (1982).

Shanjun, L.. et al.: "Synthesis of Compounds with More than One Benzotriazole Group in the Molecule"; Monatshefte fur Chemie 114, 937-951 (1983).

Degen: "Infrared Spectra"; 4900260; APSPA4; Appl. Spectrosc.; 22; 1968; 164; Chem. Abstr.; 3059; 1960.

* cited by examiner

US 7,057,264 B2

CURABLE COMPOUNDS CONTAINING REACTIVE GROUPS: TRIAZINE/ISOCYANURATES, CYANATE ESTERS AND BLOCKED ISOCYANATES

FIELD OF THE INVENTION

This invention relates to triazine compounds, isocyanurate compounds, cyanate ester compounds, or blocked isocyanate compounds that can act as anti-oxidants for metal substrates or metal surfaces, and particularly for copper, to improve the adhesion between metal substrates and adhesives, coatings or encapsulants.

BACKGROUND OF THE INVENTION

In the assembly of a semiconductor package to a printed wire board, an integrated circuit chip is attached to a metal lead frame, in many case, a copper coated leadframe, with adhesive and wire bonding, and the whole assembly then encapsulated in a molding resin. After encapsulation, the outer leads of the lead frame are attached to a printed circuit board. During storage and transportation, any metal, and particularly, copper surfaces are subject to oxidation with exposure to air. Such uncontrolled oxidation is detrimental to adhesion between the lead frame and any adhesive or molding compound, and subsequently detrimental to the reliability of the whole lead frame package. To alleviate this problem, lead frame manufacturing routinely includes a process to apply an antioxidant coating onto the lead frame surface.

Nitrogen-containing compounds such as benzotriazoles are commonly used as antioxidants and corrosion inhibitors for copper and copper alloys in many environments and applications. The aromatic moiety of the benzotriazoles is believed to help reinforce a parallel alignment onto the metal substrate and the nitrogen rich triazole to serve as an adhesion promoter. When benzotriazole is applied as a coating, the copper surface is blocked from direct contact with air and moisture, which inhibits oxidation to certain level. However, the presence of benzotriazoles is suspected of interfering with the bonding process during the die attach, wire bonding, encapsulation, and final soldering operations in the manufacture of the semiconductor package and its attachment to a printed circuit board. Such interference probably is caused by the physical separation between the copper substrate and die attach or molding compound and by the absence of any chemical bond between the antioxidant layer and die attach or molding compound. Benzotriazole is also known to be thermally unstable at the temperatures that are used for die attach adhesive curing and testing, which are typically at 170° C. and above. The decomposition products and processes of benzotriazoles remain little understood, and hence unpredictable in terms of their interference in the reliability of the lead frame packages.

SUMMARY OF THE INVENTION

This invention is directed to compounds that can be used as anti-oxidants for exposed metal surfaces, and also as adhesion promoters for adhesive, coating or encapsulant resins that are applied to the metal substrates. These compounds include triazine or isocyanurate compounds bearing reactive or polymerizable functional groups, polyfunctional cyanate esters, and polyfunctional blocked-isocyanates. Two attributes of these compounds that make them successful as adhesion promoters for resins applied on metal substrates are the presence of nitrogen with lone electron pairs, and the presence of functional groups that can react and form a chemical bond with the resins to be adhered to the metal substrate.

The lone electron pairs on the nitrogen will coordinate with the metal substrate: a direct attach in the case of cyanate esters, and a parallel attach in the case of triazines, isocyanurates, and blocked isocyanates by physical absorption. The lone electron pairs of the nitrogens further facilitate the coordination of the nitrogen atoms to the Cu substrates in the event any oxidation occurs to form $Cu^+$ or $Cu^{2+}$ ions or oxides.

In the case of the triazines and isocyanurates, the functional group can be any reactive or polymerizable functional group, and preferably is an epoxy, allyl, vinylether, hydroxyl, acrylate or methacrylate group. In the case of the polyfunctional cyanate esters and isocyanates, these groups themselves are homo-polymerizable or are reactive with complementary reactive groups, such as, epoxy, carboxyl, hydroxyl and amine functionalities.

In a particular application, the compounds can be used in semiconductor packaging operations. The compounds are coated on metal leadframes, and through the nitrogen containing moieties, bond to the metal substrate; via the additional functional group on the compound, they react with adhesives, coatings or encapsulants used in the fabrication of semiconductor packages.

In a further embodiment, this invention relates to a metal leadframe and silicon die assembly, in which the metal leadframe is coated with a triazine or isocyanurate compound bearing reactive or polymerizable functional groups, a polyfunctional cyanate ester, or a polyfunctional blocked-isocyanate and the silicon die is attached to the leadframe with an epoxy, acrylate or bismaleimide based adhesive.

DETAILED DESCRIPTION OF THE INVENTION

The triazine/isocyanurate compounds will have the structures:

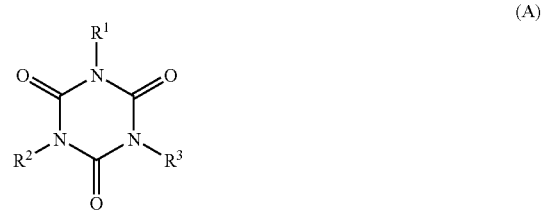

(A)

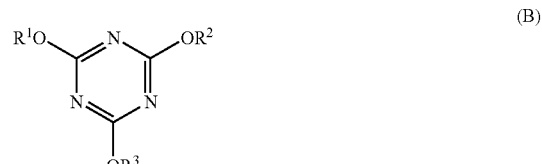

(B)

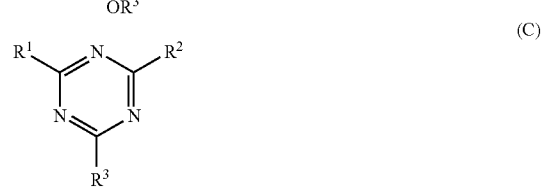

(C)

in which structures (A) and (B) represent isomers of isocyanurates; (C) represents triazines; and $R^1$, $R^2$, and $R^3$ represent an organic moiety containing a reactive functionality, preferably an epoxy, allyl, amine, vinylether, hydroxyl, acrylate or methacrylate group. $R^1$, $R^2$, and $R^3$ can be the same or different for each molecule. The three nitrogen atoms on the center ring of triazine and isocyanurate compounds provide parallel molecular access to the metal substrate Commercially available examples of such compounds include: 1,2,4-tris(2-hydroxyethyl)-1,2,4-triazine-3,5,6(1H, 2H,4H)-trione; 1,3,5-tris(cyanomethyl)hexahydro-1,3,5-triazine; 1,3,5-triacrylohexahydro-1,3,5-triazine, 1,3,5-triallyl-1,3,5-triazine-2,4,6(1H,3H,5H)-trione; 1,3,5-triazine; 1,3,5-triazine-2,4,6-trithiol trisodium; 1,3,5-tris[3-(dimethylamino)propyl]hexahydro-1,3,5-triazine; 1,3,5-tris (2-hydroxyethyl)cyanuric acid; 2,4,6-tri(2-pyridyl)-1,3,5-triazine; 2,4,6-triallyoxy-1,3,5-triazine; 2,4,6-tris(2-pyridyl)-s-triazine; 2,6,4-trianilino-1,3,5-trizine; cyanuric acid potassium salt; melamine; oxonic acid; triallyl cyanurate; triallyl-1,3,5-triazine-2,4,6(1H,3H,5H)-trione; trithiocyanuric acid; trithiocyanuric acid trisodium salt nonahydrate; and tris(2,3-epoxypropyl)isocyanurate.

The cyanate ester compounds will contain two or more cyanate ester functionalities. Preferred compounds are represented by the structures:

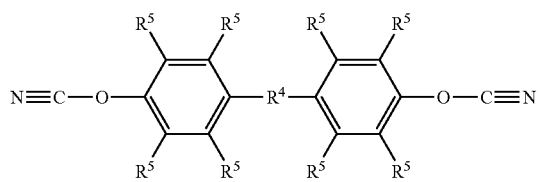
(D)

and

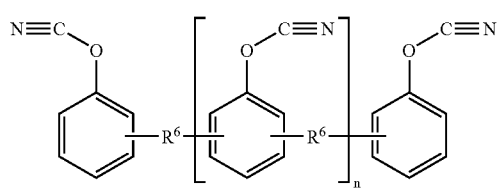
(E)

in which

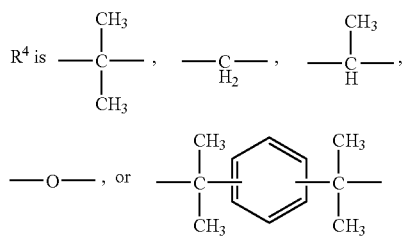

$R^5$ is H or $CH_3$;

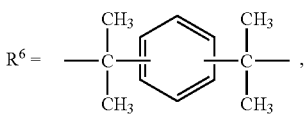

and n is 0.2 to 0.3

In one preferred embodiment, the cyanate ester will be difunctional. One of the cyanate ester functionalities will interact with the metal substrate, and the other cyanate ester functionality will react with a complementary reactive functionality on another resin present. Examples of other resins containing complementary reactive functionalities include cyanate esters, epoxies, amines, polyols, and phenols. Commercially available cyanate esters are available from Vantico, Lonza and Oakwood (such as L-10 and XU366).

The blocked isocyanates are adducts of a mono- or multi-functional isocyanate and a blocking group. The blocking group, before reaction with the isocyanate, contains an active hydrogen atom, such as from a hydroxyl or amine functionality, and will react with at least one of the isocyanate functionalities, although all the isocyanate functionalities on a molecule may be blocked.

Examples of suitable isocyanates include tolylene diisocyanate, hexane diisocyanate trimer, hexane diisocyanate biuret, isophorone diisocyanate, and isophorone diisocyanate trimer. Examples of suitable blocking groups include 3,5-dimethylpyrazole, oxime, methylethyl ketoxime, ε-caprolactam, nonophenyl, and diethyl melonate. Commercially available blocked isocyanates are available from Baxenden Chemicals, Ltd (such as those sold under product numbers BI7770, 7772, 7773, 7779, 7673, 7952, 7985, 7986).

Below the unblocking temperature, the blocked isocyanate can bind to metal surfaces, in particular copper, via the nitrogens in the isocyanate functionality or via the nitrogens in the blocking group. Above the unblocking temperatures the released blocking groups can act as catalysts for polymerizations, for example, of epoxies or maleimides that may be present in other resins used in the manufacturing operations The freed isocyanate groups can react with epoxy, hydroxyl and amine functionality that may be present in those resins.

If commercially available leadframes have been treated previously with benzotriazole, the benzotriazole preferably is removed before treating with the triazine/isocyanurates, cyanate esters or blocked isocyanates of this invention. The benzotriazole is removed with an acidic persulphate solution and a water rinse. The leadframe is treated with 1% sulfuric acid to activate the surface, which is then rinsed with water. Alternatively, the anti-oxidants described in this invention can be applied directly after etching (for patterning) or stamping (also for patterning) or electroplating of the circuitry on the leadframe, without the benzotriazole removal process described above.

If the anti-oxidant to be used is soluble in water, an aqueous solution is prepared at concentration ranges or 0.05 to 20% w/w (weight of solute in weight of solvent), preferably 0.1 to 10% w/w, and held at a temperature within the range of room temperature to 80° C. The leadframe is dipped into the solution at this temperature for a few minutes and rinsed with water at 60° C. for 30 seconds to one minute. It is then dried under nitrogen at a temperature within the range of room temperature to 60° C. for one hour.

If the anti-oxidant to be used is soluble in organic solvents, a solution is prepared at a concentration within the range of 0.05 to 20%, preferably 0.1 to 2% w/w, in acetone or methanol. The leadframe is given an acetone or methanol rinse and then is dipped in the anti-oxidant solution for a few minutes, rinsed with acetone or methanol, and dried under nitrogen for one hour at room temperature.

In another embodiment, this invention comprises the coated lead frame and a silicon chip adhered to the lead frame and assembled into a semiconductor package. Methods for the manufacture of semiconductor packages are well known in the art. An exemplary method consists of the following. The substrate for holding the semiconductor chip within the semiconductor package is a metal leadframe, in many packages, a copper leadframe, which can be described as a frame with a center area within the frame containing a paddle on which the silicon chip will be mounted. A plurality of metal leads extend from ends integral with the frame to other ends adjacent to the center region of the frame and the chip paddle.

A conductive adhesive is dispensed onto the chip paddle, a silicon chip is contacted with the adhesive, using light pressure and/or heat to soften the adhesive. The assembly is cured, typically in an atmosphere of dry nitrogen, at an appropriate temperature and time to effect cure for the specifica adhesive used. For example, a typical curing schedule for an epoxy is to ramp from room temperature to 175° C. within 30 minutes and dwell at this temperature for additional 15 minutes. Such curing schedules will be known to those skilled in the art or supplied by the manufacturer of the adhesive.

Active terminals on the surface of the silicon chip are then connected to the active terminals on the surface of the metal leadframe with a fine metal wire or ribbon in an automated operation known as wire-bonding. The wire bonded assembly is then protected by encapsulation in a polymeric material. Encapsulation is performed by a transfer molding process, in which the assembly is loaded into a mold cavity, constrained, and the polymeric encapsulant transferred from a reservoir into the cavity under pressure, and finally cured.

In order to benefit from the inventive anti-oxidative coating on the leadframe, the conductive adhesive attaching the semiconductor chip to the leadframe paddle preferably is reactive with the anti-oxidative coating. That is, the adhesive will have a reactive functionality complementary to the reactive functionality on the triazine compound or isocyanurate compound, if either of those is the coating material used, or will have a functionality reactive to cyanate ester or isocyanate functionality, if either of those is the coating material used.

For use with the triazine or isocyanurate coating material, the adhesive for attaching the chip to the substrate should be reactive with whatever polymerizable functional group is on the triazine or isocyanurate. Such complementary reactive functionalities are well known by those skilled in the art. For example, in those cases in which the polymerizable functional group is an epoxy, allyl, vinylether, hydroxyl, acrylate or methacrylate group, the conductive adhesive may be selected from epoxies, electron donor resins (for example, vinyl ethers, vinyl silanes, thiol-enes, and resins that contain carbon to carbon double bonds attached to an aromatic ring and conjugated with the unsaturation in the aromatic ring, such as compounds derived from cinnamyl and styrenic starting compounds), and, electron acceptor resins (for example, fumarates, maleates, acrylates, and maleimides). One skilled in the art will understand which functionalities are reactive with each other.

For use with polyfunctional cyanate ester and blocked isocyanate coatings, the conductive adhesive may be selected from cyanate esters, isocyanates, epoxies, and with other resins containing carboxyl, hydroxyl or amine functionalities. Suitable curable conductive resins meeting these criteria are known to those skilled in the art.

EXAMPLES

In the following examples, adhesives were dispensed onto copper leadframe substrates whose surfaces were treated to remove benzotriazole as described above in this specification. Silicon dies were then attached onto the lead frames with an adhesive and the adhesive was cured. (The exact curing profile depended on the composition used. Ascertaining the appropriate curing profile is within the expertise of one skilled in the art, or will be as disclosed by the supplier.) Leadframes as received from the manufacturer were used as the controls.

The cured assemblies were subjected to 85° C./85% relative humidity for 48 hours, after which the die was sheared from the copper leadframe at 90 degrees with a Dage 2400-PC Die Shear Tester at 260° C. (hot-wet die shear-hwds). The die shear strength values as well as the percent cohesive failure were measured and are reported.

Example 1

Two silver filled adhesives were prepared one comprising an epoxy resin (EPO), and the other comprising a bismaleimide and epoxy blend (BMI/EPO). The adhesives were used to attach silicon dies to copper leadframes and tested for hot-wet die shear strength and percent cohesive failure as described above. The anti-oxidants used to coat the leadframes were the following labeled A through D:

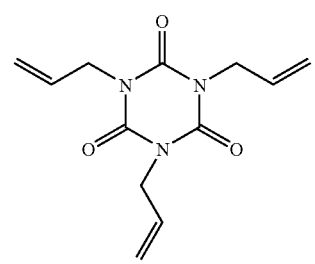

Antioxidant A

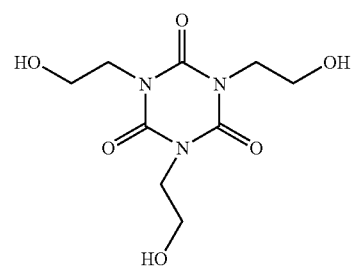

Antioxidant B

Antioxidant C

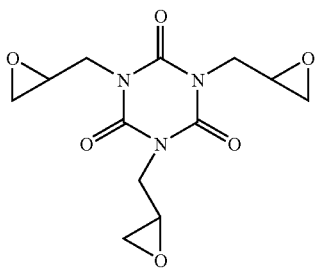

Antioxidant D

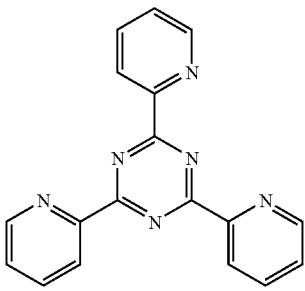

Ten assemblies for the control and for each triazine/isocyanurate antioxidant were prepared for each adhesive and the results pooled and averaged. The results of the hot-wet die shear strength (HWDS) test in Kg force and percent cohesive failure (% coh) are reported in the following table:

|  | No treatment | Antioxidant A | Antioxidant B | Antioxidant C | Antioxidant D |
|---|---|---|---|---|---|
| EPO |  |  |  |  |  |
| HWDS kg | 4.0 | 10.1 | 10.6 | 11.1 | 9.9 |
| % coh | 10 | 98 | 95 | 70 | 85 |
| BMI/EPO |  |  |  |  |  |
| HWDS kg | 8.9 | 16.2 | 15.5 | 15.2 | 11.6 |
| % coh | 30 | 70 | 45 | 60 | 40 |

The results indicate that the use of triazine and isocyanurate based anti-oxidants to coat metal improves the performance of adhesives on that metal substrate.

Example 2

The same adhesives and procedures for hot-wet die shear strength and percent cohesive failure were used on leadframes coated with a cyanate ester having the following structure:

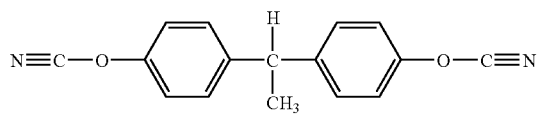

Ten assemblies for the control and for the cyanate ester antioxidant were prepared for each adhesive and the results pooled and averaged. The results are reported in the following table and indicate that the use of the cyanate ester based anti-oxidant (CE) to coat metal improves the performance of adhesives on that metal substrate.

|  | No treatment | Antioxidant CE1 | Antioxidant CE2 |
|---|---|---|---|
| EPO |  |  |  |
| HWDS kg | 7.6 | 9.9 | 11.3 |
| % coh | 60 | 90 | 80 |
| BMI/EPO |  |  |  |
| HWDS kg | 2.3 | 8.6 | 11.1 |
| % coh | 0 | 30 | 40 |

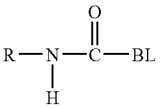

Example 3

The same adhesives and procedures for hot-wet die shear strength and percent cohesive failure were used on leadframes coated with blocked isocyanates (BI) having the following structure:

Where RN(H)C=O— represents the isocyanate molecule after being adducted to the blocking group. Suitable starting isocyanates include, but are not limited to, tolylene diisocyanate, hexane diisocyanate trimer, hexane diisocyanate biuret, isophorone diisocyanate, and isophorone diisocyante trimer. BL represents a blocking group after being adducted to the starting isocyanate. Suitable starting blocking groups include, but are not limited to, 3,5-dimethylpyrazole, oxime, methylethyl ketoxime, ε-caprolactam, nonophenyl, and diethyl melonate. These blocked isocyanates are stable at room temperature, and will release the BL group at the unblocking temperature. For instance, 3,5-dimethylpyrazole blocked isocyanates, as blocking agents, can be released at 120° C.:

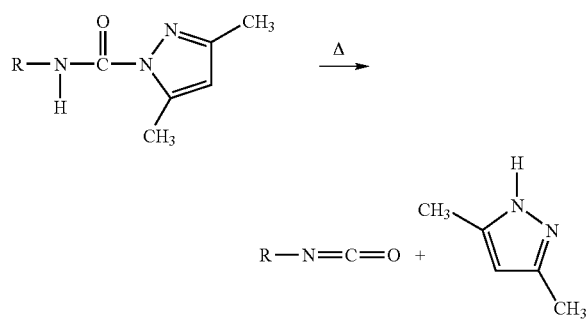

Ten assemblies for the control and for each blocked isocyanate antioxidant were prepared for each adhesive and the results pooled and averaged. The results are reported in the following table and indicate that the use of the blocked isocyanate based anti-oxidant (BI) to coat metal improves the performance of adhesives on that metal substrate.

|  | No treatment | Antiox BI | Antiox BI | Antiox BI | Antiox BI | Antiox BI | Antiox BI | Antiox BI |
|---|---|---|---|---|---|---|---|---|
| EPO |  |  |  |  |  |  |  |  |
| HWDS Kg | 7.5 | 7.5 | 8.0 | 9.1 | 7.5 | 8.3 | 8.3 | 9.0 |
| % coh | 60 | 95 | 95 | 95 | 90 | 95 | 90 | 95 |
| BMI/EP |  |  |  |  |  |  |  |  |
| HWDS Kg | 9.2 | 16.1 | 14.3 | 13.4 | 12.0 | 11.2 | 13.0 | 12.9 |
| % coh | 5 | 70 | 50 | 60 | 35 | 35 | 40 | 35 |

What is claimed:

1. A copper coated leadframe onto which is deposited first a solution of
   (i) a triazine or isocyanurate compound containing a polymerizable functionality,
   (ii) a cyanate ester compound, or
   (iii) a blocked isocyanate compound; and
   second an adhesive and a semiconductor die in which the adhesive is in contact with the solution of triazine, isocyanurate, cyanate ester, or blocked isocyanate compound and in which the adhesive contains a polymerizable functionality reactive with the triazine, isocyanurate, cyanate ester, or blocked isocyanaye compound.

2. The copper coated leadframe according to claim 1 in which the solution is an aqueous solution with a concentration range from 0,05 to 20% w/w.

3. The copper coated leadframe according to claim 3 in which the solution is an aqueous solution with a concentration range from 0.1 to 10% w/w.

4. The copper coated leadframe according to claim 1 in which the solution is an organic solution with a concentration range from 0.1 to 2% w/w.

5. The copper coated leadframe according to claim 1 in which the triazine has the structure

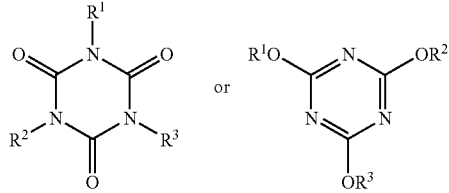

in which $R^1$, $R^2$, and $R^3$ represent an organic moiety containing an epoxy, allyl, amine, vinylether, hydroxyl, acrylate or methacrylate group.

6. The copper coated leadframe according to claim 1 in which the isocyanurate has the structure

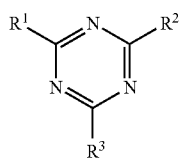

in which $R^1$, $R^2$, and $R^3$ represent an organic moiety containing an epoxy, allyl, amine, vinylether, hydroxyl, acrylate or methacrylate group.

7. The copper coated leadframe according to claim 1 in which the cyanate ester has the structure

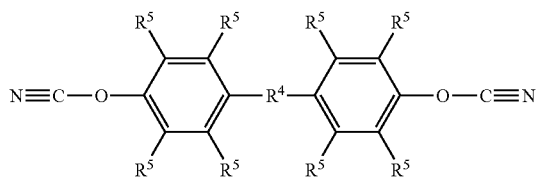

in which R⁴ is

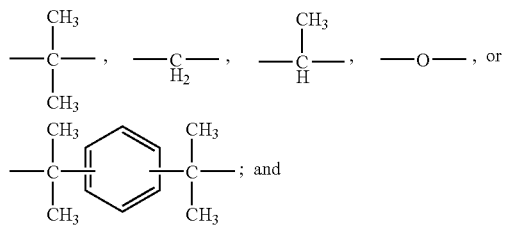

R⁵ is H or CH₃.

8. The copper coated leadframe according to claim 1 in which the blocked isocyanate compound is an adduct of an isocyanate selected from the group consisting of tolylene diisocyanate, hexane diisocyanate trimer, hexane diisocyanate biuret, isophorone diisocyanate, and isophorone diisocyanate trimer with a blocking group selected from the group consisting of 3,5-dimethyl pyrazole, oxime, methylethyl ketoxime, ϵ-caprolactam, and diethyl melonate.

* * * * *